United States Patent [19]

Horikoshi et al.

[11] 4,030,949

[45] June 21, 1977

[54] METHOD OF EFFECTING LIQUID PHASE EPITAXIAL GROWTH OF GROUP III-V SEMICONDUCTORS

[75] Inventors: Yoshiji Horikoshi, Seki; Yoshitaka Furukawa, Musashino, both of Japan

[73] Assignee: Nippon Telegraph and Telephone Public Corporation, Tokyo, Japan

[22] Filed: June 26, 1975

[21] Appl. No.: 590,554

[30] Foreign Application Priority Data

July 4, 1974  Japan ............................. 49-75817

[52] U.S. Cl. ..................... 148/171; 148/33.5; 148/172; 148/1.5; 156/625; 156/612; 331/94.5 H
[51] Int. Cl.² ..................................... H01L 21/208
[58] Field of Search ............ 331/94.5 H; 148/33.5, 148/171, 1.5, 172, 175; 156/612, 17; 252/62.3 GA

[56] References Cited

UNITED STATES PATENTS

| | | | |
|---|---|---|---|
| 3,294,600 | 12/1966 | Yokota | 148/177 |
| 3,687,744 | 8/1972 | Ogirima et al. | 148/175 |
| 3,755,013 | 8/1973 | Hollan | 148/172 |
| 3,780,358 | 12/1973 | Thompson | 331/94.5 H X |
| 3,933,538 | 1/1976 | Akai et al. | 148/171 |

*Primary Examiner*—G. Ozaki
*Attorney, Agent, or Firm*—Flynn & Frishauf

[57] ABSTRACT

Disclosed is a method of yielding a multilayer-liquid phase epitaxial growth of $Al_xGa_{1-x}As$ and GaAs for manufacturing a double heterostructure laser, light emitting diode, etc., which is characterized in that hydrogen gas or inert gas, containing GaCl gas, is used as an atmosphere for the epitaxial growth. This method permits the liquid phase epitaxial growth of a semiconductor layer even on an $Al_xGa_{1-x}As$ ($x \geq 0.3$) which is once exposed to the air or subjected to an etching treatment. Accordingly, this method is suitable for the manufacture of a semiconductor element having a buried active layer. This method also permits the manufacture of an epitaxial wafer having a low dislocation density.

4 Claims, 16 Drawing Figures

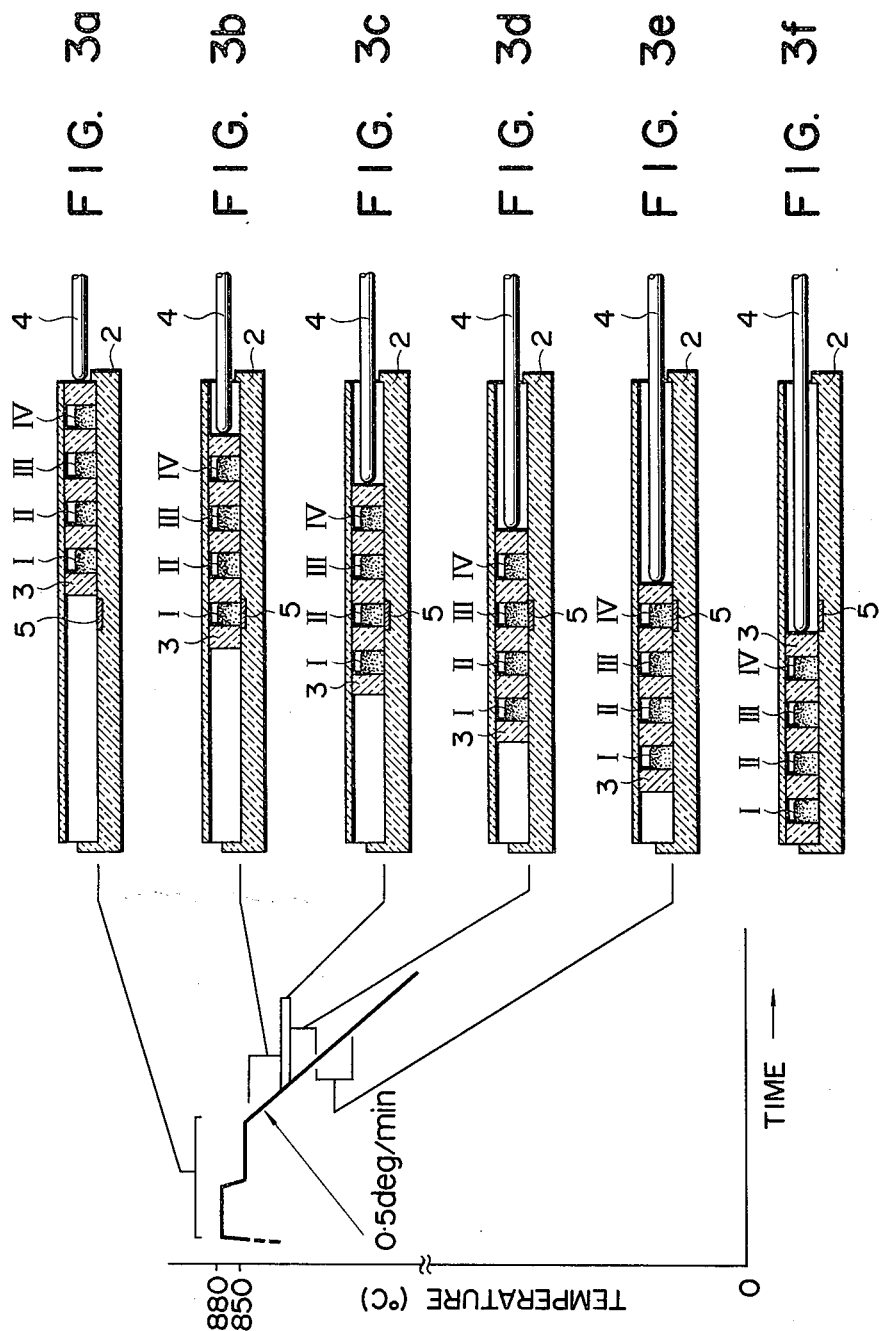

METHOD OF EFFECTING LIQUID PHASE EPITAXIAL GROWTH OF GROUP III-V SEMICONDUCTORS

This invention relates to a method of effecting the liquid phase epitaxial growth of III-V group semiconductors for manufacturing an improved epitaxial growth layer of multilayer junction, and to a semiconductor device, particularly a semiconductor laser and light emitting diode, manufactured using said manufacturing method.

With respect to the method for liquid phase epitaxial growth of III-V group semiconductors, there have been proposed a number of methods including Nelson's method, Slide boat method, Rotary boat method, etc. It has been reported by B. I. Miller, E. Pinkas, I. Hayashi, and R. J. Capik that a GaAS-$Al_xGa_{1-x}As$ double heterostructure (DH) injection laser is manufactured by the liquid phase epitaxial growth method (J. Appl. Phys. Vol. 43, No. 6 June 1972, 2817–2826). Conventionally, in the Slide boat method, i.e., a liquid phase epitaxial growth method using a slide boat, GaAs single crystal, for example, is used as a substrate, and a solution consisting of Ga, GaAs, Al and a dopant selected from Te, Zn and Ge as a melt. These components are weighed out in order to make the proportion of the components of an epitaxial layer in a desired ratio. Said GaAs single crystalline substrate and solution are put into a quartz-made reaction tube filled with a reducing or inert atmosphere such as hydrogen gas or argon gas, and are heated at high temperature. After the ternary solution of Al-Ga-As is maintained at a certain temperature for a while and brought to an equilibrium state, it is allowed to contact the substrate. When subsequently cooled at a proper cooling rate, the solution is supersaturated to create an $Al_xGa_{1-x}As$ crystal of a prescribed component on the GaAs single crystalline substrate. Thus, an epitaxial layer is formed on this substrate. Where multilayer growth is effected by using the above-mentioned Slide boat method, a solution contributing to crystal growth is contacted with the substrate for an extremely short time, for example, 0.5 second or less and separated from the crystal as crystallized. This solution is then replaced with another solution contributing to the next crystal growth thereby to effect the formation of the second epitaxial crystal layer on the substrate. By repeatedly carrying out the same process the epitaxial growth is completed. In effecting a GaAs or AlGaAs-liquid phase epitaxial growth on the GaAlAs crystal layer, however, it is often impossible to achieve a uniform growth. Particularly even in the liquid phase epitaxial growth effected in a hydrogen atmosphere, where the surface of a AlGaAs layer on which epitaxial crystal growth is to be effected is exposed to the hydrogen atmosphere for 30 seconds or more, the epitaxial crystal growth of a GaAs or AlGaAs layer is not uniformly effected on said AlGaAs surface. This tendency is prominent particularly where the Al content in the GaAlAs layer exceeds 10%. This is considered as due to the contamination (oxidation) of the Al by a minute amount of impurity (oxygen) present in the hydrogen atmosphere.

When the liquid phase epitaxial crystal growth layer is applied to the formation of a semiconductor device, the AlGaAs layer often happens to be exposed to the air. In such a case, however, it has been thought impossible in the prior art to cause the liquid phase epitaxial crystal growth of a GaAs or AlGaAs layer.

This invention has been achieved with a view to eliminate the above mentioned prior art drawbacks.

An object of the invention is to provide a method for permitting the liquid phase epitaxial crystal growth of a GaAs or AlGaAs layer on a AlGaAs layer even after the AlGaAs layer is exposed to the air or further subjected to various treatments including an etching treatment.

Another object of the invention is to provide a liquid phase epitaxial crystal growth method capable of obtaining, in the AlGaAs and GaAs-liquid phase epitaxial growth, a high quality of junction having less defects at the boundary surfaces between a substrate and the first epitaxial layer and between epitaxial layers.

Still another object of the invention is to provide an improved liquid phase epitaxial growth method for effecting the epitaxial growth of a GaAs or AlGaAs layer on that AlGaAs layer having a given proportion, in manufacturing buried type elements such as a semiconductor laser, light emission diode or light guide, wherein an element structure in particular having an active layer is embedded in a clad layer, and preliminarily exposed to the air and subjected to various treatments.

According to the invention, there is provided a liquid phase epitaxial growth method comprising the step of allowing, while a reducing gas or inert gas is being passed through a reaction tube, a melt to contact a substrate using a slide boat provided within the reaction tube, thereby to form an epitaxial growth-layer in turn, characterized in that when either one of GaAs or $Al_xGa_{1-x}As$ is epitaxially grown on an $Al_xGa_{1-x}As$ layer, the epitaxial crystal growth is effected while a mixed gas of either one of the reducing gas or inert gas and one compound selected from the group consisting of $GaCl_3$, $AsCl_3$, HCl, $NH_4F$ and $NH_4Cl$ is being passed through the reaction tube.

This invention can be more fully understood from the following detailed description when taken in conjunction with the accompanying drawings, in which:

FIGS. 3a to 3f are views for explaining the liquid phase epitaxial growth of a 4-layer structure effected by the method of the invention;

Figure 7A:
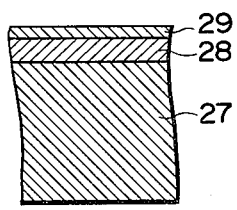
Figure 7B:
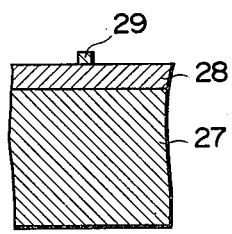
Figure 7C:
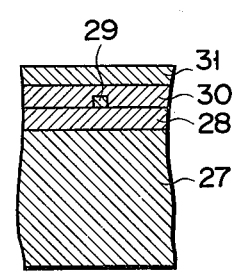
Figure 6:
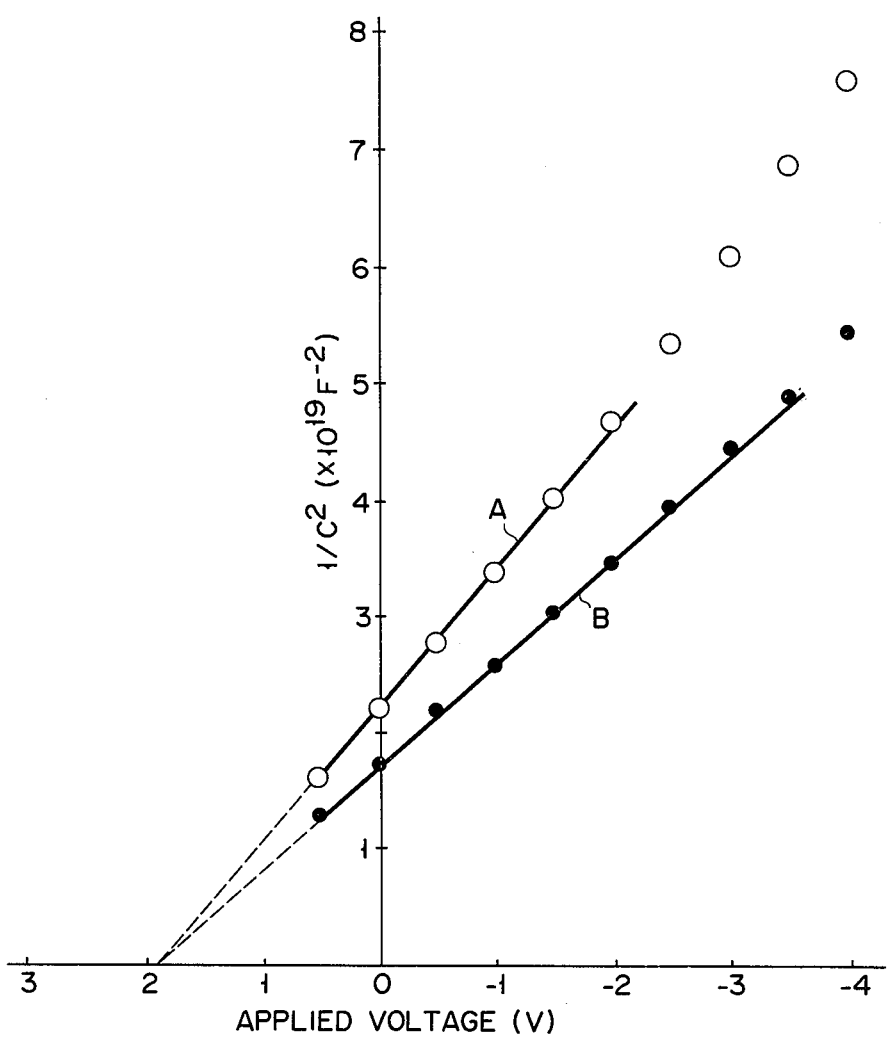

FIG. 6 diagramatically illustrates the relation between the applied voltage and $1/C^2$ of a P-N junction obtained by causing the liquid phase epitaxial growth of an $Al_{0.3}Ga_{0.7}As$ layer on an $Al_{0.3}Ga_{0.7}As$ substrate by using the method of the invention; and FIGS. 7a to 7c are views for explaining the manufacturing processes of a buried-type element based on the use of the method of the invention.

Figure 1:
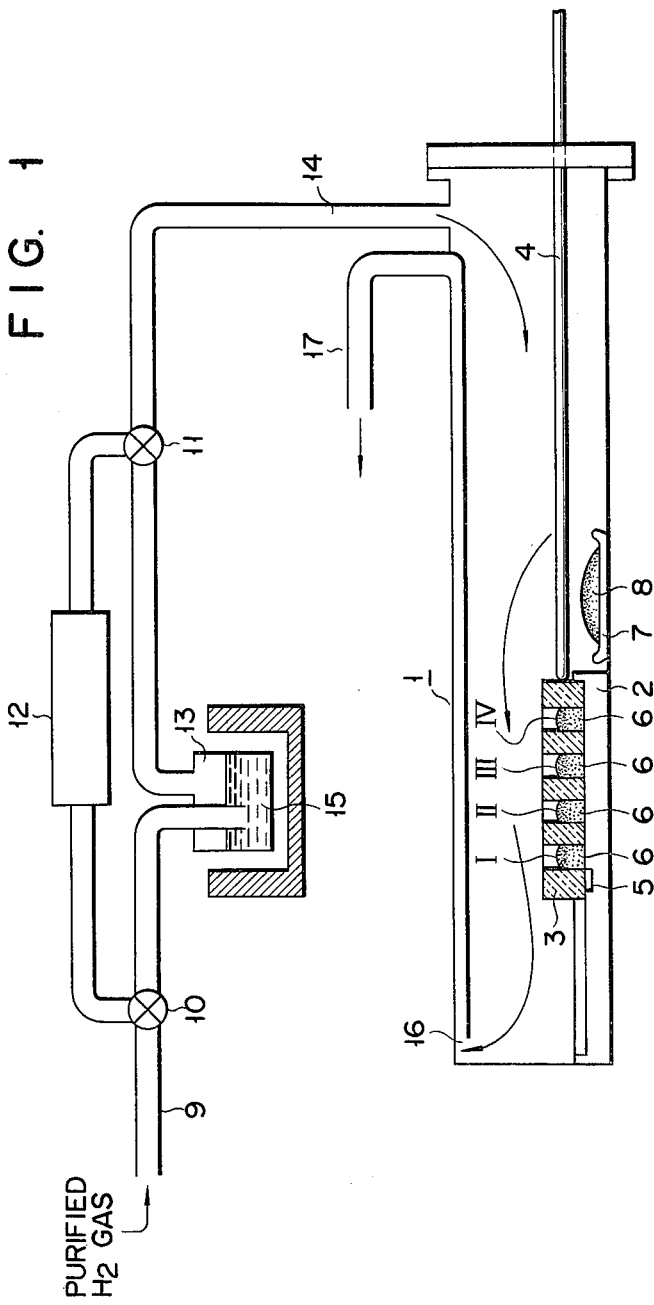
FIG. 1 illustrates a device for causing a liquid phase epitaxial crystal growth to explain an example of the invention.

This invention will be more fully understood from the illustrated examples. FIG. 1 schematically illustrates a device for causing a liquid phase epitaxial crystal to grow on a semiconductor substrate using a slide boat. 1 is a reaction tube, in which a carbon boat body 2 is disposed. Further, a carbon slider 3 is slidably mounted on the boat body 2 along the longitudinal direction of the boat body 2 so as to be operated by an operating rod 4 provided in the vicinity of one end of the slider 3. In the slider 3 are formed four melt boxes 6, in which are received lots of melt I, II, III and IV for liquid phase growth, respectively. These melts are arranged to be properly brought into contact with a single crystalline semiconductor substrate 5 disposed in the boat body 2, in accordance with the sliding movement of the slider 3. In the vicinity of an end of the boat body 2 is disposed a basket 7 in which is contained metal gallium 8.

Hydrogen gas and arsenic trichloride ($AsCl_3$) gas are arranged to be introduced into the reaction tube 1 from one end-side thereof. That is, a purified hydrogen gas is first introduced through a tube 9 and then is sent into a flow quantity control apparatus 12 or a bubbler 13 through operation of three way stop-cocks 10 and 11, respectively, and then is sent into a tube 14 and thus is introduced into the reaction tube 1 through said one end thereof. An $AsCl_3$ liquid 15 is received in the bubbler 13 and is introduced, in a gaseous form, into the reaction tube 1 through the tube 14 together with the hydrogen gas. The other end of the reaction tube 1 is formed with an exhaust port 16 so that a gas atmosphere within the reaction tube 1 can be exhausted outside the device through a tube 17.

There will now be described the operation of the liquid phase epitaxial growth device according to the invention. The n-GaAs single crystalline substrate 5 doped with silicon, whose dimensions are 10 mm × 10 mm × 0.5 mm, is fixed to a prescribed position of the boat body 2. This substrate 5 was prepared by cutting off the n-GaAs single crystal at <001> plane, and abrading this single crystal plane to an extent of 20 $\mu$m with alumina having a particular size of about 5 $\mu$m, and subsequently abrading that single crystal plane with alumina having a particle size of 0.3 $\mu$m until a mirror plane is obtained, and etching that single crystal plane with a 10% etching solution of bromo methanol, and etching off that single crystal plane to an extent of 10 $\mu$m. The melt boxes 6 of the slider 3 are charged respectively with the melt I (containing 4g Ga, 0.22g GaAs, 0.004g Al and 0.0005g Te), the melt II (containing 4g Ga, 0.26g GaAs and 0.0005g Te), the melt III (containing 4g Ga, 0.20g GaAs, 0.004g Al, 0.08g Ge) and the melt IV (containing 4g Ga, 0.25g GaAs and 0.08g Ge) from the left side of the illustration in the order mentioned. Thereafter, these melts are fixedly provided within the reaction tube 1 as illustrated in FIG. 3a. Next, a gas atmosphere within the reaction tube is exhausted by a vacuum pump until the reaction tube interior has a pressure of nearly $10^{-3}$ Torr. Subsequently, a hydrogen gas as purified by a palladium film is introduced and, after confirming that the hydrogen gas pressure within the reaction tube 1 has exceeded the external pressure, an external cock (not shown) connecting to the tube 17 is opened to provide a $H_2$ gas-steady flow of approximately 200 cc/min. within the reaction tube 1. At this stage, the reaction tube 1 is put into an electric furnace and the furnace temperature is so adjusted that the boat 2 temperature becomes 870° C. Note that at this time temperature of the entire region of the boat body 2 (having a length of approximately 200 mm) is uniformly held with the temperature discrepancy of ±0.5° C maximum.

When the indicated temperature of a thermocouple mounted within the boat body 2 has exceeded 800° C, the flow rate of the hydrogen gas is reduced to 30 cc/min. and the cocks 10, 11 at both sides of the bubbler 13 are so opened as to permit the hydrogen gas to pass through the bubbler 13 in which the $AsCl_3$ liquid is received. As a result, a hydrogen gas containing the $AsCl_3$ is introduced into the reaction tube 1. This mixed gas reacts under a temperature within the reaction tube to become a HCl + $As_4$ gas. The $As_4$ is adsorbed by the gallium 8 placed in the vicinity of the boat body 2, while the HCl reacts with the gallium 8 to produce a sub-halide of GaCl. Note here that the gallium 8 is set at an amount sufficient for these reactions, for example, 20g. This GaCl is carried toward the boat body 2 by the hydrogen gas and is thought to etch the peripheral surface portions of the melts 6 and the surface layer of the GaAs substrate 5 thereby to remove the oxide films and suppress the formation of new oxide films.

The resulting assembly (comprising reaction tube 1 and all members housed therein, including slider 3, boat body 2, melt boxes 6, Ga basket 7 and Ga 8) under the above-mentioned condition is held at 870° C for approximately 20 minutes and then is gradually cooled at the rate of 1° C per minute down to 845° C. The said assembly is held at this temperature for 20 minutes and subsequently starts to be gradually cooled at the rate of 0.5° C per minute. When the assembly temperature has become 840° C, the slider 3 is moved, and under the condition wherein the melt I contacts the GaAs substrate 5 as illustrated in FIG. 3b the first layer commences to grow on the substrate 5. This first layer growth is continued until the assembly temperature is reduced to 830° C. The slider 3 is further moved to bring the melt II into contact with the substrate 5 as illustrated in FIG. 3c thereby to effect the second layer growth. This second layer growth is continued until the device temperature is reduced to 829.5° C, for 1 minute, and thereafter the melt III is soon allowed to contact the substrate 5 as illustrated in FIG. 3d thereby to effect the third layer growth until the assembly temperature is reduced to 822° C. Next, as illustrated in FIG. 3e, the melt IV is allowed to contact the substrate 5 thereby to effect the fourth layer growth until the temperature is lowered to 820° C. Thereafter, as illustrated in FIG. 3f the substrate 5 is wiped off to complete the epitaxial growth-process. At this stage, the cocks 10, 11 are closed to permit only a purified hydrogen gas to pass through the reaction tube 1 at a flow quantity of 200 cc/min. Thereafter, the reaction tube 1 is taken out from the electric furnace. Thus, there is obtained a semiconductor device wherein the GaAs substrate has formed thereon the $Al_{0.05}Ga_{0.95}As$ first layer, GaAs second layer, $Al_{0.05}Ga_{0.95}As$ third layer, and GaAs fourth layer.

In the preceding example, the use of $AsCl_3$ together with a $H_2$ gas was described. But also in the case where $GaCl_3$ or HCl is employed in place of the $AsCl_3$ or where an Ar gas is employed in place of the $H_2$ gas, a GaCl gas is finally evolved in the growth reaction-region. Therefore, also in such cases the invention can be practised similarly, and yet can have similar effects, to the aforesaid example.

Figure 2:
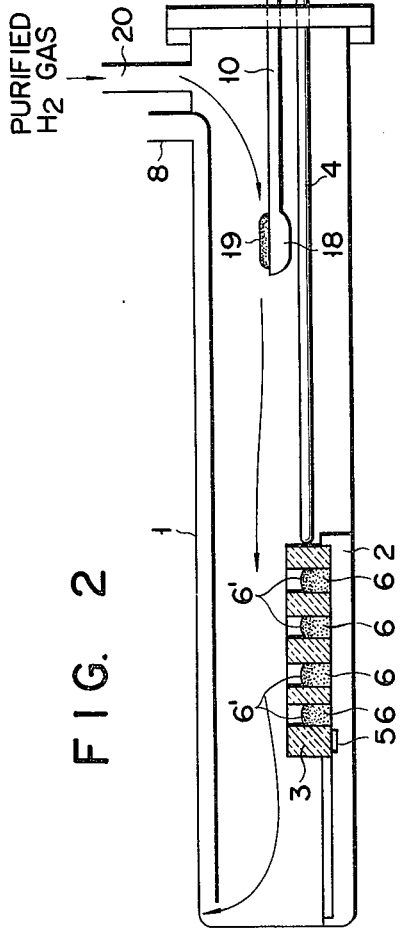
FIG. 2 illustrates the device for causing a liquid phase epitaxial crystal growth to explain another example of the invention.

FIG. 2 illustrates an example of using one compound selected from the group consisting of $AlCl_3$, $NH_4F$, and $NH_4Cl$ as a gas being mixed with a reducing $H_2$ gas. A liquid phase epitaxial growth device illustrated in FIG.

2 is only different from that illustrated in FIG. 1 in the following respects. That is, in FIG. 1 the gallium 8 is disposed within the reaction tube 1 whereas in FIG. 2 any one of $AlCl_3$, $NH_4F$ and $NH_4Cl$ is disposed in a stream of $H_2$ gas within the reaction tube 1. Element 10 of FIG. 2 is a quartz rod having the tip portion shaped like a dish and movable by operation from outside. Further, the device of FIG. 2 does not particularly require the flow quantity control apparatus 11 and the bubbler 13. With respect to the carbon boat 2, carbon slider 3, melt boxes 6, etc., their respective constructions and operations are the same as those explained above with reference to FIGS. 1 and 3.

To explain the operation of the example illustrated in FIG. 2, the boat body 2 in which the substrate 5 is disposed and which has a slider 3 mounted thereon, is fixed within the reaction tube 1, said slider 3 having quantities of melts 6' received therein. Further, a basket 18 having a quantity of aluminum trichloride ($AlCl_3$) 19 received therein is disposed at a position properly spaced from the boat body 2. Subsequently, a purified $H_2$ gas is sent from a $H_2$ gas-introducing port 20 into the reaction tube 1 in the same manner as in FIG. 1, and is exhausted from the exhaust port 8 to provide a steady flow of $H_2$ gas. Subsequently, the device as a whole is put into an electric furnace and an epitaxial growth-layer is sequentially formed on the substrate 5 in the same manner as in FIGS. 1 and 3. At this time, the $AlCl_3$ in the basket 18 is evaporated by a proper amount under a prescribed temperature and is carried toward the boat body 2 by the $H_2$ gas. This $AlCl_3$, upon contact of the crystalline substrate 5 with the melt 6', acts as if it were a flux, to improve the wetting of the melt 6' on the crystalline substrate 5. Thus, there is obtained a semiconductor device whose crystalline substrate and junction surfaces are of good quality.

Also in the case where ammonium fluoride ($NH_4F$) or ammonium chloride ($NH_4Cl$) is employed in replacement of aluminum trichloride, or where an Ar gas is employed in replacement of the $H_2$ gas, the invention can be practiced similarly, and yet can have similar effects, to the example of FIG. 2.

Figure 4B:
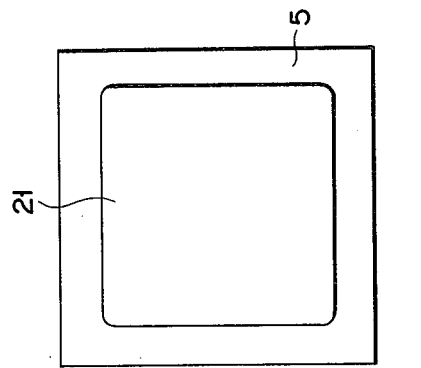
FIGS. 4a and 4b are views illustrating the conditions of residues on wafers obtained by the prior art method and by the method of the invention, respectively.
Figure 4A:
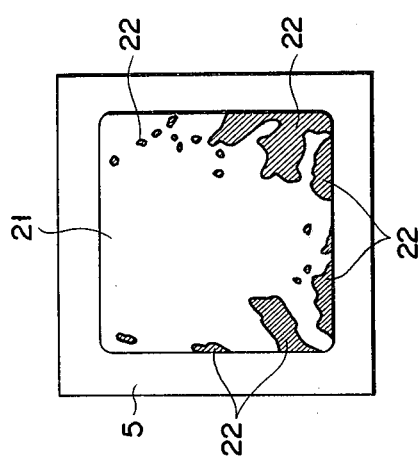

Next, for comparing the effect obtainable by the epitaxial growth method of the invention with that obtainable by the prior art method, an $Al_{0.3}Ga_{0.7}As$ layer and a GaAs layer were epitaxially grown on a GaAs substrate 5 under the same condition as above explained with reference to FIG. 1, that is, by introduction of only a $H_2$ gas into the reaction tube 1, except that $AsCl_3$ is not introduced into the reaction tube 1. As a result, as illustrated in FIG. 4a, the surface of an epitaxial growth-layer 21 according to this prior art method was recognized to have a residual oxide film 22. In contrast, as illustrated in FIG. 4b, the surface of an epitaxial growth-layer 21 according to the method of the invention, obtained in the example of FIG. 1, was not substantially recognized to have any residual oxide film.

Figure 5A:
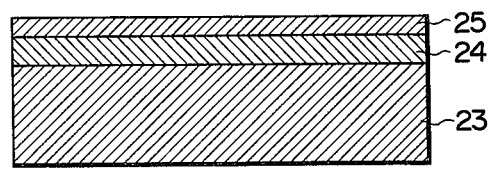
FIGS. 5a and 5b are views illustrating cleaved sections of the epitaxial wafers obtained by the method of the invention and by the prior art method.
Figure 5B:
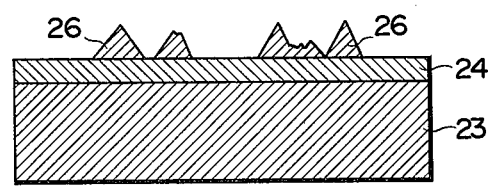

FIGS. 5a and 5b illustrate the surface conditions of epitaxial growth-layers obtained by the method of the invention and the prior art method, respectively. A semiconductor device illustrated in FIG. 5a is the one wherein an $Al_{0.3}Ga_{0.7}As$ layer 24 is epitaxially grown on a GaAs substrate 23 and after being exposed to air, an $Al_{0.05}Ga_{0.95}As$ layer 25 is further epitaxially grown on the GaAs substrate 23 in accordance with the example of FIG. 1. The surface of this $Al_{0.05}Ga_{0.95}As$ layer 25 was confirmed to be wholly smooth. In contrast, with respect to an $Al_{0.05}Ga_{0.95}As$ layer epitaxially grown under the same condition as above mentioned except that any one of $GaCl_3$, HCl, or $AsCl_3$ was not introduced into the reaction tube 1, its surface had a large number of island-shaped or pyramid-shaped $Al_{0.05}Ga_{0.95}As$ crystals 26 as illustrated in FIG. 5b. The formation of this island-shaped epitaxial growth-layer 26 becomes prominent particularly where the wafer is once allowed to contact the air and similarly becomes prominent as the Al content in the wafer is increased. Where the wafer is exposed to the air for a long time, difficulty is presented even in forming such island-shaped growth-layer 26. In contrast, according to the method of the invention, an $Al_xGa_{1-x}As$ layer 24 or GaAs layer having such a uniform surface as illustrated in FIG. 5a could be formed even where the $Al_xGa_{1-x}As$ layer 24 was exposed to the air for a long time.

In order to confirm with respect to a semiconductor device obtained by the method of the invention that the surface of its epitaxial growth-layer is made smooth and therefore a good quality of junction having less boundary defects is obtained, there was prepared a P-N junction wherein an $Al_{0.3}Ga_{0.7}As$ layer was epitaxially grown on an $Al_{0.3}Ga_{0.7}As$ layer, and the C-V characteristics of this P-N junction were measured, the results being presented in FIG. 6. In FIG. 6, a line A represents a diode having an area of $350\mu \times 460\mu$ and a line B a diode having an area of $460\mu \times 460\mu$. As seen from FIG. 6, any one of the two diodes had the value $1/C^2$ taking a substantially linear form proportionally to the applied voltages with the built-in voltage of 1.9 volts as a starting point. In an abrupt junction, its depletion layer capacitance C can be expressed by the equation, as disclosed in S. M. Sze, Physics of Semiconductor Devices; John Wiley and Sons Inc. (1969) page 90:

$$C = \sqrt{\frac{q \cdot \epsilon_s N_B}{2(V_{bi} \pm V)}} \text{ (pH/cm}^2\text{)}$$

where $V_{bi}$ represents the built-in voltage, $\pm V$ the applied voltage, $q$ the charge of electrons, $\epsilon_s$ the dielectric constant, and $N_B$ the effective density of an impurity used. Accordingly the above equation can be rewritten as follows.

$$\frac{1}{C^2} = \frac{2}{q \cdot \epsilon_s N_B} (V_{bi} \pm V)$$

This indicates that if the $1/C^2 - V$ characteristics are linear, the abrupt junction is uniform.

Further, in order to investigate the presence of boundary defects in the junction of the semiconductor device obtained by the method of the invention, a photoluminescence pattern was taken of the semiconductor device. As a result, a uniformly luminesced pattern was obtained and the junction of this semiconductor device was not substantially recognized to have any boundary defect. In contrast, the photoluminescence pattern of the semiconductor device obtained by the prior art method was an ununiformly luminesced pattern having many dark spots of $10^5/cm^2$ or more. These patterns are those obtained as follows by aiming at the fact that an $Al_xGa_{1-x}As$ layer where $x$ ranges from 0.3 to 0.4 permits transmission of a light having a wavelength of 6700 Å or more but a GaAs layer does not permit transmission of a light having a wavelength of 9000 A or less. That is, said patterns are obtained by exciting the surface of the GaAs substrate through the $Al_xGa_{1-x}As$ layer by a light capable of being transmitted through the $Al_xGa_{1-x}As$ layer but not transmitted through the GaAs substrate, for example, by a light of 6764 A wavelength or 7993 A wavelength radiated by a krypton laser, and enlarging the light emitted from that substrate by an objective lens and detecting this light by an IR-sensitive vidicon and photographing this detected light by a monitor television. The surface of the epitaxial layer obtained by the method of the invention not only has no dark spots in its photoluminescence pattern, but also is decreased in the density of its defects. That is, the surface of the epitaxial layer according to the prior art method has defects of $10^3/cm^2$ whereas the surface of the epitaxial layer according to the invention has defects of $10^2/cm^2$ or less.

There will now be described an example wherein a buried type element is manufactured by the method of the invention. Conventionally, it was regarded as difficult to cause a GaAs layer or $Al_xGa_{1-x}As$ layer to be grown directly on an $Al_xGa_{1-x}As$ substrate by the liquid phase epitaxial growth. Particularly in the case of the $Al_xGa_{1-x}As$ substrate exposed to the air, such direct epitaxial growth was regarded as completely impossible. For this reason, the method of once melting the $Al_xGa_{1-x}As$ substrate surface into a liquid phase and thereafter effecting an epitaxial growth was customarily carried out. That is, a melt provided for melting a substrate thereinto or for effecting the first layer-growth is allowed to contact the $Al_xGa_{1-x}As$ substrate, and under this condition the mass temperature is increased to permit the substrate surface to be melted back by the extent of several or scores of microns. Thus, the first layer-epitaxial growth was effected. Since, in this way, this method involves therein a melt-back process, the respective applicability of that method is low and further even when the substrate is subjected to fine working, the resulting pattern is deformed due to the melting-back action to remarkably decrease the precision with which wafer manufacture is made.

According to the method of the invention, however, as illustrated in FIG. 7a, even in the case where an $Al_xGa_{1-x}As$ substrate 28 is epitaxially grown on a GaAs substrate 27 and a GaAs or $Al_xGa_{1-x}As$ active layer 29 is further epitaxially grown on the substrate 28, this active layer 29 is rendered uniform in quality. As illustrated in FIG. 7b, accordingly, a $SiO_2$ thin film is formed, in accordance with the known method, on this active layer 29 and thereafter a stripe-shaped pattern of $SiO_2$ is formed thereon, and that active layer 29 is etched off with a 10% etching solution of bromomethanol so as to have a corresponding stripe-shaped portion (2 to 3μm in width) left, and an $Al_xGa_{1-x}As$ layer 30 and a GaAs layer 31 have only to be further epitaxially grown on said stripe-shaped portion in accordance with the above-mentioned method of the invention as illustrated in FIG. 7c.

Since, in this way, the method of the invention requires no melt-back process at all, a fine pattern obtained by working the substrate by etching is formed thereon as it is. As a result, the wafer manufacture is made with extremely high precision and in increased yield, which offers a great advantage in manufacturing a buried type semiconductor laser, light emission-diode, light guide, etc.

As above described in detail, according to the invention, a GaAs layer or AlGaAs layer can be easily epitaxially grown on the AlGaAs layer containing 10% or more of aluminum, and particularly even after the AlGaAs layer is drawn out into the air or even after it is subjected to various treatments such as an etching treatment, such GaAs layer or AlGaAs layer can be epitaxially grown on the AlGaAs layer. Further, the boundary surface of the epitaxial growth-layer thus obtained remarkably decreased in defects to provide a good quality junction. Therefore, a semiconductor laser, light emission diode, etc. having good properties such as, for example, an elongated life can be obtained. Further, in the prior art method, an oxide film is formed on the surface of a melt for epitaxial crystal growth and the resulting nonuniform surface is likely to cause damage to the wafer surface when the boat sliding is effected, thereby strikingly decreasing the crystal growth-efficiency. In contrast, however, the method of the invention suppresses the formation of an oxide film. Accordingly, there is no such fear as in the prior art method.

What we claim is:

1. In a method for manufacturing a buried type semiconductor laser comprising:
    a. the step of preparing a GaAs single crystalline substrate;
    b. the step of effecting alternately the liquid phase epitaxial crystal growth of an $Al_{0.3}GA_{0.7}As$ layer and an $Al_{0.05}Ga_{0.95}As$ layer on said GaAs single crystalline substrate;
    c. the step of coating $SiO_2$ on the surface of said $Al_{0.05}Ga_{0.95}As$ layer to form a stripe-shaped pattern and etching said $Al_{0.05}Ga_{0.95}As$ layer by an etching solution to form a stripe-shaped $Al_{0.05}Ga_{0.95}As$ layer on said $Al_{0.3}Ga_{0.7}As$ layer; and
    d. the step of effecting the liquid phase epitaxial crystal growths of an $Al_{0.3}Ga_{0.7}As$ layer and a GaAs layer on said $Al_{0.3}Ga_{0.7}As$ layer and stripe-shaped $Al_{0.05}Ga_{0.95}As$ layer;

the improvement which is characterized in that said liquid phase epitaxial growths are carried out in a mixed gas atmosphere of GaCl and $H_2$.

2. In a method of producing liquid phase epitaxial growths of GaAs and $Al_yGa_{1-y}As$ on an $Al_xGa_{1-x}As$ substrate, comprising allowing melts to contact the substrate using a slide boat, wherein a mixed gas containing a gas selected from the group consisting of hydrogen gas and an inert gas, and another gas selected from the group consisting of $AsCl_3$ and HCl is passed through a reaction tube, thereby to form epitaxial growth layers in turn, the improvement which comprises disposing a boat filled with metal gallium in the vicinity of the gas-introducing side of said slide boat, the amount of the metal gallium being sufficient for a reaction with the mixed gas to evolve GaCl gas, and maintaining over said substrate and melts an atmosphere of a mixed gas containing either one of hydrogen gas and an inert gas together with GaCl gas.

3. A liquid phase epitaxial growth method according to claim 2, wherein said substrate is preliminarily exposed to the air for a period long enough to form a stripe-shaped pattern on the substrate.

4. A liquid phase epitaxial growth method according to claim 2, wherein the epitaxial growths are carried out by gradually cooling the slide boat which is initially set at 870° down to 820° C.

* * * * *